United States Patent
Kearney et al.

(10) Patent No.: US 9,607,924 B2
(45) Date of Patent: Mar. 28, 2017

(54) POWER SEMICONDUCTOR MODULE AND METHOD FOR COOLING POWER SEMICONDUCTOR MODULE

(71) Applicant: ABB Technology Oy, Helsinki (FI)

(72) Inventors: Daniel Kearney, Zürich (CH); Francesco Agostini, Zofingen (CH); Didier Cottet, Zürich (CH); Daniele Torresin, Winterthur (CH); Mathieu Habert, Baden Daettwill (CH)

(73) Assignee: ABB Technology OY (FI)

( * ) Notice: Subject to any disclaimer, the term of this patent is extended or adjusted under 35 U.S.C. 154(b) by 0 days.

(21) Appl. No.: 14/824,871

(22) Filed: Aug. 12, 2015

(65) Prior Publication Data

US 2016/0049354 A1 Feb. 18, 2016

(30) Foreign Application Priority Data

Aug. 14, 2014 (EP) .................................... 14181005

(51) Int. Cl.
| | |
|---|---|
| *H01L 23/34* | (2006.01) |
| *H01L 23/473* | (2006.01) |
| *H01L 23/538* | (2006.01) |
| *H05K 1/02* | (2006.01) |
| *H01L 23/31* | (2006.01) |

(Continued)

(52) U.S. Cl.
CPC ........ *H01L 23/473* (2013.01); *H01L 23/3121* (2013.01); *H01L 23/5389* (2013.01); *H05K 1/0272* (2013.01); *H01L 2924/0002* (2013.01); *H05K 1/185* (2013.01); *H05K 3/4697* (2013.01); *H05K 2201/0116* (2013.01); *H05K 2201/064* (2013.01)

(58) Field of Classification Search
CPC  H01L 23/3121; H01L 23/473; H01L 23/5389
USPC .......................................... 257/714; 438/122
See application file for complete search history.

(56) References Cited

U.S. PATENT DOCUMENTS

| | | |
|---|---|---|
| 2005/0111188 A1 | 5/2005 | Bhattacharya et al. |
| 2006/0197219 A1 | 9/2006 | Lee et al. |

(Continued)

FOREIGN PATENT DOCUMENTS

| | | |
|---|---|---|
| JP | 2001-308470 A | 11/2001 |
| WO | 99/06782 A1 | 2/1999 |
| WO | 2009/143682 A1 | 12/2009 |

OTHER PUBLICATIONS

European Patent Office, European Search Report issued in European Patent Application No. 14181005.1 dated Feb. 13, 2015, 8 pp.

(Continued)

*Primary Examiner* — Trung Q Dang
(74) *Attorney, Agent, or Firm* — Taft Stettinius & Hollister LLP

(57) ABSTRACT

The present disclosure relates to a power semiconductor module comprising a printed circuit board (PCB), and to method of cooling such a power semiconductor module. The module comprises a power semiconductor device and an island of thermally conducting foam embedded into the printed circuit board. The power semiconductor device and the island of thermally conducting foam are positioned on top of each other, and the island is arranged to form a path for a flowing coolant cooling the power semiconductor device.

5 Claims, 3 Drawing Sheets

(51) Int. Cl.
  *H05K 1/18* (2006.01)
  *H05K 3/46* (2006.01)

(56) References Cited

U.S. PATENT DOCUMENTS

2010/0288535 A1* 11/2010 Hong ............... H01L 23/5389
                                                    174/252
2012/0043127 A1   2/2012 Lin et al.

OTHER PUBLICATIONS

Ozmat, B., et al., "A New Power Module Packaging Technology for Enhanced Thermal Performance", 2000 Inter Society Conference on Thermal Phenomena, IEEE, 10 pp.

Haussener, Sophia, "Tomography-Based Determination of Effective Heat and Mass Transport Properties of Complex Multi-Phase Media", Diss. ETH No. 19365, A dissertation submitted to ETH Zurich, 2010, 234 pp.

Boomsma, K., et al., The Effects of Compression and Pore Size Variations on the Liquid Flow Characteristics in Metal Foams, Journal of Fluids Engineering, Mar. 2002, vol. 124, 10 pp.

\* cited by examiner

POWER SEMICONDUCTOR MODULE AND METHOD FOR COOLING POWER SEMICONDUCTOR MODULE

FIELD OF THE INVENTION

The present invention relates to power semiconductor modules and particularly to cooling of power semiconductor modules.

BACKGROUND INFORMATION

Power electronic devices in a lower power range (e.g. devices with power ratings less than about 50 kW) are often based on printed circuit board (PCB) constructions. Traces of both a main power circuit and signal electronics may be integrated into the PCB. Electrical components, such as semiconductor switches, passive components, and integrated circuits (IC), are typically attached to the surface of the PCB by soldering. By using PCBs, mass production costs may be reduced, while device compactness may be increased.

As more components are integrated to PCBs, power dissipation per area unit of the PCBs also increases. Further, components on a PCB may have diverse cooling demands, particularly if the PCB comprises embedded power semiconductors. As a result, localized hot spots may appear on the PCB. FIG. 1 shows an exemplary embodiment of a typical three-phase inverter module configuration containing six IGBTs 11 and six diodes 12, where each chip is sintered to one surface of a copper substrate. In FIG. 1, fixed, uniform cooling conditions (6000 W/cm²K) were applied to the opposite surface of the package. Despite the high cooling rate, hot spots were prevalent in the package due to the non-uniform heat dissipation between the IGBTs and the diodes.

Non-uniform thermal conditions may induce thermal stresses and thermal fatigue in a PCB package over the lifetime of the package, which may lead to mechanical failures, such as delamination or cracking.

Microfluidic interlayers have been considered in some thermal management areas (e.g. electronics packaging and photonics) where high heat transfer coefficients and a local hot spot management are primary requirements. However, microchannels may be complex to manufacture. Further, microchannel implementations often relate to specific module/package designs and may not be implementable as such to other package designs.

BRIEF DISCLOSURE

An object of the present invention is to provide a power semiconductor module and a cooling method for a semiconductor module so as to alleviate the above disadvantages. The objects of the invention are achieved by a method and a module which are characterized by what is stated in the independent claims. The preferred embodiments of the invention are disclosed in the dependent claims.

Thermally conductive foams (TCFs) may be used in PCB-based modules for the purpose of convective thermal management. With TCFs, an effective flow control of a coolant, and a subsequent hot spot cooling, may be achieved. A layer of TCF may be placed into the PCB substrate, and this interlayer may be used for directing the flow of a coolant to specific areas of the package in order to improve convective heat transfer with the embedded components. Unlike in a microchannel structure, the coolant flow path may be controlled by the porosity of the foam, whereby the coolant is forced to flow to areas with a lower bulk density (i.e. a higher porosity) and hence a lower flow resistance. The TCF layer may form a specific interposer layer in direct or indirect contact with the chip lead frame.

Flow of coolant may be controlled by varying spatial porosity of the TCF, thereby allowing hot spot cooling. A specific flow path may be attributed to each package by means of a pre-fabricated TCF layer, for example. A TCF layer can be pre-designed to have increased cooling directly underneath the chips where hot spots are prevalent. As a result, a more uniform heat flux within the package and hence a reduction in thermal-related failures may be achieved. Such an implementation may also reduce the thermal resistance $R_{th}$ of the package [3]. In addition, the pore direction (e.g. pore elongation in the direction of flow) may also be controlled to minimize pressure drop.

The disclosed cooling design has a high manufacturability: it does not require expensive routing of channels through the substrate, which reducing induced thermal stresses in the board and manufacturing time. The disclosed cooling design has minimal material costs due to low volume of the TCF material. The resulting cooling is lightweight and has good mechanical and structural properties.

BRIEF DESCRIPTION OF THE DRAWINGS

In the following the invention will be described in greater detail by means of preferred embodiments with reference to the attached drawings, in which.

DETAILED DISCLOSURE

The present disclosure presents a power semiconductor module comprising a printed circuit board (PCB). The PCB comprises at least one power semiconductor device and thermally conducting foam (TCF) embedded in the printed circuit board. The power semiconductor device may be a diode or a semiconductor switch, for example. The thermally conducting foam refers to a porous material that is thermally conducting and through which coolant can pass. The thermally conducting foam may be open-cell metal foam made of aluminium or copper, for example.

Figure 1:
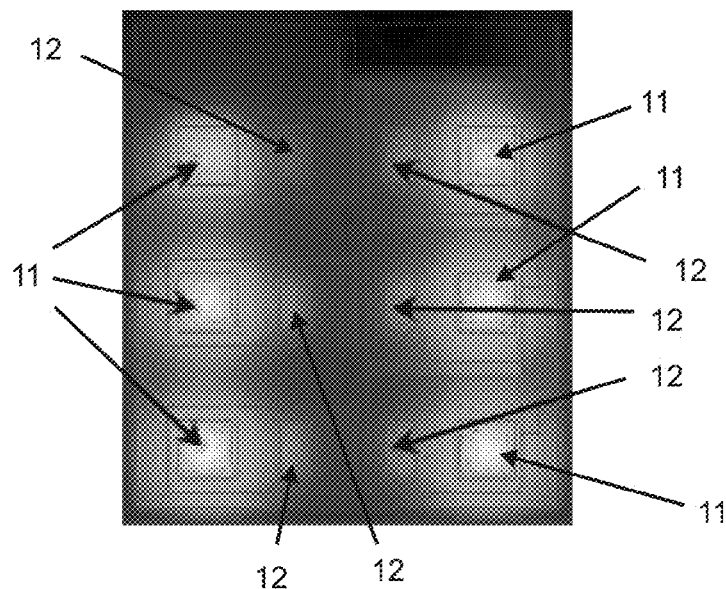
FIG. 1 shows an exemplary embodiment of a typical three-phase inverter module configuration containing six IGBTs and six diodes, where each chip is sintered to one surface of a copper substrate.
Figure 2:
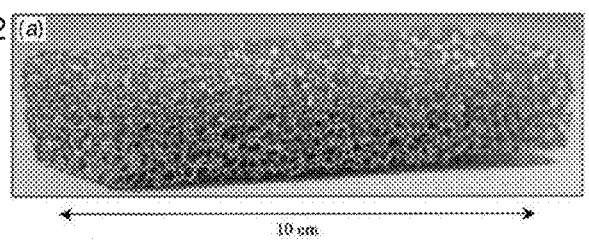
FIGS. 2(a) to 2(c) show details of an exemplary block of aluminium foam.
Figure 2:
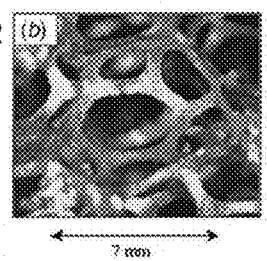
Figure 2:
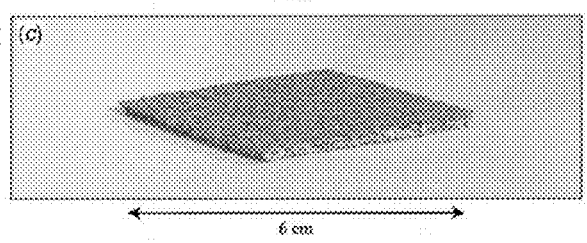

FIGS. 2(a) to 2(c) show details of an exemplary block of aluminium foam. FIG. 2(a) shows an aluminium foam block, which measures 10.0 cm×4.0 cm×1.5 cm, and is 92% porous (10 pores per linear inch=6.9 mm pore diameter). FIG. 2(b) shows a magnified view of a single pore of the foam block of FIG. 2(a). The pore size (i.e., the approximate diameter of the pore) is 7 mm in FIG. 2b. FIG. 2(c) shows the exemplary aluminium foam block as depicted in FIG.

2(a), but now having its bulk volume compressed by a factor of four, which reduced the porosity from 92% to 76% [1].

The power semiconductor device and the TCF are positioned on top of each other. The TCF is arranged to form a path for a coolant cooling the power semiconductor device. In order to cool the power semiconductor device, a coolant is supplied through the thermally conducting foam. The foam conducts heat from the power semiconductor device and transfers the heat to the coolant through convection. A layer of TCF may be placed into the PCB substrate, and this interlayer may be used to direct the flow of coolant to specific areas of the package in order to improve convective heat transfer with the embedded component or components.

A TCF layer in a module according to the present disclosure may be pre-designed to have increased cooling at desired locations, e.g. directly under the chips causing hot spots. Coolant flow paths may be controlled by varying the (spatial) porosity of the TCF, which allows a localized hot spot cooling. The layer of TCF may comprise portions having different average pore sizes, for example. The average pore size and porosity density may be controlled by compressing the TCF, for example. A prefabricated TCF block/blocks similar to that illustrated in FIGS. 2 (a) to 2(c) may be integrated into a PCB, for example.

The coolant may be guided to flow to areas with a lower bulk density. For example, a portion of foam closest to the power semiconductor device may have higher an average pore size in order to achieve a larger flow of coolant in the portion of foam closest to the power semiconductor device. A specific flow path may be attributed to each package by means of a pre-fabricated TCF layer.

In addition, the TCF may be made more permeable to a coolant in one direction than in another. The pore direction (e.g. pore elongation in the direction of flow) may be controlled to minimize pressure drop. In order to achieve yet more uniform thermal distribution in a module according to the present disclosure, the thermal conductivity of the foam may also be controlled. A power semiconductor module according to the present disclosure may comprise a TCF layer that comprises portions having different thermal conductivities, for example. For example, a sacrificial poreformer process using graphite particles with diameters in two different size ranges can adapt foam substrates such that structural anisotropy can occur in the porosity, affecting thermal conductivity, flow path and local thermal performance [2].

Figure 3:
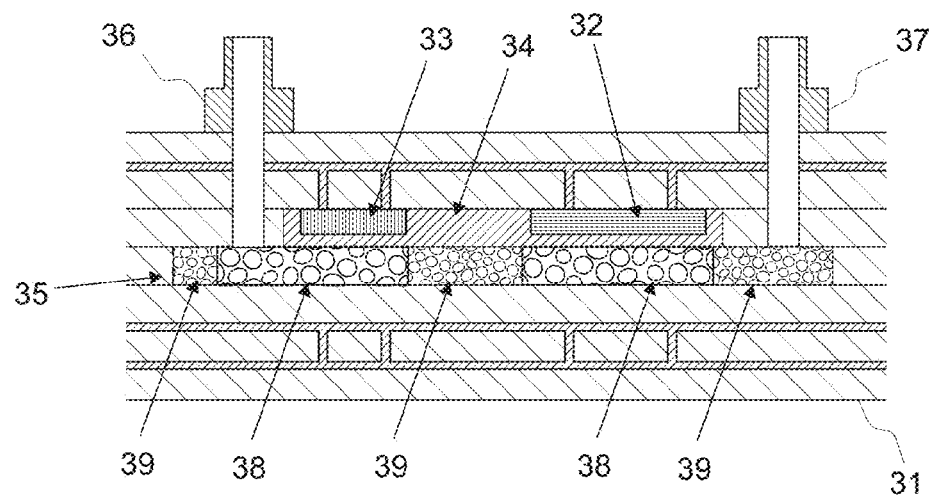
FIG. 3 shows a simplified, exemplary embodiment of a power semiconductor module according to the present disclosure.

FIG. 3 shows a simplified, exemplary embodiment of a power semiconductor module according to the present disclosure. In FIG. 3, a cross-section of a PCB package 31 with embedded chips and a TCF layer is shown. The PCB 31 may comprise a plurality of pre-preg layers.

In FIG. 3, a chip of a first power semiconductor device 32 is embedded in the PCB 31 of the module. The first power semiconductor device 32 may be an IGBT or a power MOSFET, for example. In addition, a chip of a second power semiconductor device 33 is embedded in the PCB 31. The second semiconductor device may be a diode, for example. Together the devices 32 and 33 may form an upper leg or a lower leg of one branch of a three-phase inverter, for example. FIG. 3 shows copper vias 40 and copper traces 41 formed into the PCB 31. The copper vias and traces may be connected to the semiconductors and serve as electrical conductors, for example.

The chips of the devices 32 and 33 may be bonded to a substrate in the form of a lead frame, for example. FIG. 3 shows a lead frame 34, onto which the chips of the first semiconductor device 32 and the second semiconductor device 33 are bonded. The lead frame 34 may be made of metal, e.g. copper. The chips may be bonded to the lead frame 34 by soldering or sintering, for example. The chips may first be bonded to the lead frame 34, which may then be embedded in the PCB 31, for example.

FIG. 3 also shows a TCF layer 35 in the form of an island laminated between the lead frame and a pre-preg of the PCB 31. The chips of the first power semiconductor device 32 and the second semiconductor device are positioned on top of the TCF layer 35. The TCF layer 35 may form a specific interposer layer in direct or indirect contact with the chip lead frame 34. The TCF layer 35 may be bonded to the lead frame 34 by soldering or sintering and/or laminated to pre-preg material of the PCB 31, for example.

FIG. 3 shows a coolant inlet port 36 and a coolant outlet port 37 on the top layer of the PCB 31. The island 35 of TCF is arranged to form a path for the coolant cooling the power semiconductor device between the inlet port 36 and the outlet port 37.

In FIG. 3, the island of TCF 35 comprises portions 38 and 39 having different average pore sizes. The flow of coolant is controlled by the porosities of the portions 38 and 39. The coolant may be forced to flow to areas with higher porosity. The portions 38 closest to the power semiconductor devices 32 and 33 have an average pore size higher than the overall average pore size of the island 35, causing the portions 38 to have a lower flow resistance. As a result, the portions 38 of foam closest to the power semiconductor devices have an increased coolant flow.

Figure 4:
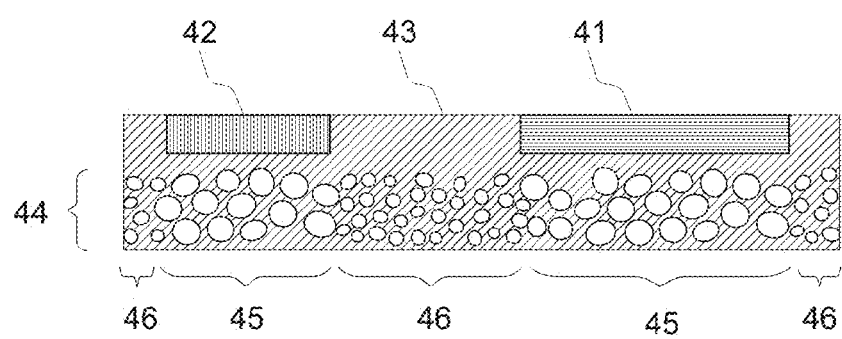
FIG. 4 shows an embodiment where a lead frame and a layer of thermally conducting foam are formed into a single piece.

In FIG. 3, the lead frame 34 and the TCF island 35 are bonded together. Alternatively, a lead frame and a layer of TCF foam may be manufactured as one piece. In this manner, a bonding step of the lead frame and the foam can be omitted, and the thermal resistance between them may be reduced. FIG. 4 shows an embodiment where a lead frame and TCF are formed into a single piece. In FIG. 4, two chips 41 and 42 are bonded to a lead frame 43 on one side. On the other side of the lead frame 43, a layer 44 of thermally conducting foam has been formed. The layer 44 comprises portions 45 and 46 having different average pore sizes.

If the TCF is made of a material that is also electrically conducting, such as copper or aluminium, the PCB of a power semiconductor module according to the present disclosure may comprise a plurality of islands of thermally conducting foam embedded into the PCB. The islands may be electrically separated (e.g. by a barrier formed by a dielectric substrate material of the PCB). Two or more of the islands may be interconnected via piping between the islands so that the islands and the piping form a path for a coolant to flow through. The coolant may be dielectric so that galvanic isolation is maintained between the islands.

Figure 5A:
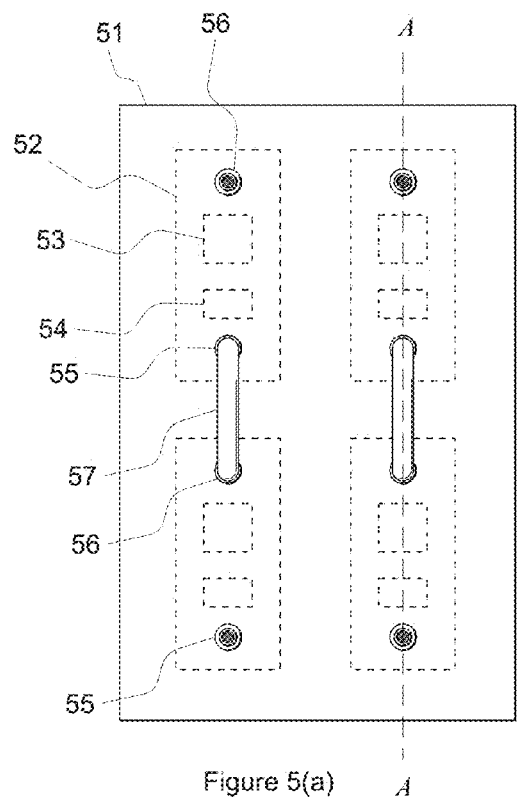
FIGS. 5(a) and 5(b) show a simplified, exemplary embodiment with a plurality of islands of thermally conducting foam.
Figure 5B:
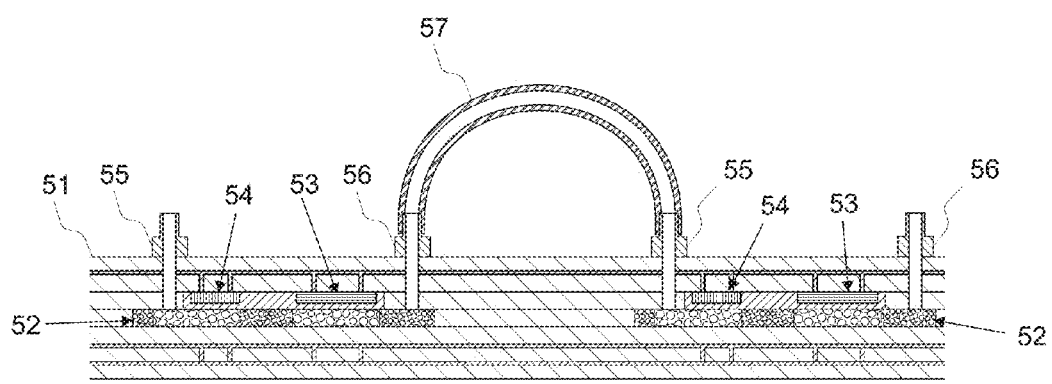

FIGS. 5(a) and 5(b) show a simplified, exemplary embodiment with a plurality of islands of TCF; FIG. 5(a) shows a top view of the embodiment; FIG. 5(b) shows a cross section along line A-A in FIG. 5(a).

In FIG. 5a, a PCB 51 of an exemplary power semiconductor module comprises four TCF islands 52. The islands 52 may be similar to that shown in FIG. 3. Two power semiconductor components 53 and 54 are positioned on top of each TCF island 52. Each island also comprises a coolant inlet port 55 and a coolant outlet port 56. FIG. 5a shows two pieces of piping in the form of external, flexible tubes 57 connecting the inlet port 55 to the outlet port 56. The tube may be made of dielectric material so that galvanic isolation is maintained between the islands 52.

FIG. 5(b) shows a cross section (along line A-A) of two islands 52 and a tube 57 connecting them. A coolant flows into the left-most inlet port in FIG. 5(b). The coolant then flows through the leftmost TCF island 52 and cools the leftmost semiconductor components 53 and 54, and then flows out of the leftmost outlet port 56. The tube 57 leads the coolant to the rightmost inlet port 55, from which the coolant flows through the rightmost island to the rightmost outlet port 56 in FIG. 5(b).

Alternatively, at least part of the piping connecting the TCF islands may be in the form of channels formed into the PCB.

It will be obvious to a person skilled in the art that the inventive concept can be implemented in various ways. The invention and its embodiments are not limited to the examples described above but may vary within the scope of the claims.

REFERENCES

[1] 2002 "The Effects of Compression and Pore Size Variations on the Liquid Flow Characteristics in Metal Foams" Boomsma K., Poulikakos, D. Journal of Fluids Engineering, DOI: 10.1115/1.1429637

[2] 2010, "Tomography-based determination of effective heat and mass transport properties of complex multiphase media" Haussener, S., PhD Thesis, ETHZ

[3] "A New Power Module packaging Technology for Enhanced Thermal Performance" B. Ozmat, C. S. Korman, P. McConnelee, M. Kheraluwala, E. Delgado and R. Fillion GE Corporate Research and Development

The invention claimed is:

1. A power semiconductor module comprising a printed circuit board which comprises
a power semiconductor device and an island of thermally conducting foam embedded in the printed circuit board, wherein
the power semiconductor device and the island of thermally conducting foam are positioned on top of each other, and the island is arranged to form a path for a flowing coolant cooling the power semiconductor device,
the foam comprises portions having different average pore sizes or bulk densities, and
a portion of foam closest to the power semiconductor device has a higher average pore size in order to achieve a larger flow of coolant in the portion of foam closest to the power semiconductor device.

2. A power semiconductor module as claimed in claim 1, wherein the foam comprises portions having different thermal conductivities.

3. A power semiconductor module as claimed in claim 1, wherein the module comprises a plurality of islands of thermally conducting foam, wherein at least two islands are interconnected via a piece of piping so that the two islands and the piping form a path for a coolant to flow through.

4. A method for cooling a power semiconductor device embedded in a printed circuit board, wherein the method comprises
embedding thermally conducting foam in the printed circuit board such that the power semiconductor device and the thermally conducting foam are positioned on top of each other, and that the foam forms an island that conducts a coolant cooling the power semiconductor device, wherein the foam comprises portions having different average pore sizes or bulk densities, wherein a portion of foam closest to the power semiconductor device has a higher average pore size in order to achieve a larger flow of coolant in the portion of foam closest to the power semiconductor device, and
supplying coolant through the thermally conducting foam.

5. A power semiconductor module as claimed in claim 2, wherein the module comprises
a plurality of islands of thermally conducting foam, wherein at least two islands are interconnected via a piece of piping so that the two islands and the piping form a path for a coolant to flow through.

* * * * *